United States Patent
Kim et al.

(10) Patent No.: US 9,774,846 B2
(45) Date of Patent: Sep. 26, 2017

(54) DISPLAY DEVICE INCLUDING GATE DRIVER INCLUDING REPETITION UNITS OF STAGES

(71) Applicant: Samsung Display Co., Ltd., Yongin (KR)

(72) Inventors: Kyung-Hoon Kim, Uiwang-si (KR); Il Gon Kim, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 108 days.

(21) Appl. No.: 14/607,900

(22) Filed: Jan. 28, 2015

(65) Prior Publication Data

US 2016/0055818 A1 Feb. 25, 2016

(30) Foreign Application Priority Data

Aug. 22, 2014 (KR) .................. 10-2014-0109590

(51) Int. Cl.
| | |
|---|---|
| *G09G 3/36* | (2006.01) |
| *H04N 13/04* | (2006.01) |
| *G09G 3/00* | (2006.01) |
| *G11C 19/28* | (2006.01) |

(52) U.S. Cl.
CPC ......... *H04N 13/0497* (2013.01); *G09G 3/003* (2013.01); *G09G 3/3677* (2013.01); *G11C 19/287* (2013.01); *G09G 2310/0251* (2013.01); *G09G 2310/0286* (2013.01); *G09G 2320/0209* (2013.01); *G09G 2320/0214* (2013.01); *G09G 2330/021* (2013.01)

(58) Field of Classification Search
CPC .......... G09G 3/36; G09G 5/00; G09G 3/3266; G11C 19/00; G06F 3/038; H03K 17/687; H03K 2017/066
See application file for complete search history.

(56) References Cited

U.S. PATENT DOCUMENTS

| | | | | |
|---|---|---|---|---|
| 8,159,446 B2* | 4/2012 | Lee | ....................... | G09G 3/3677 345/100 |
| 2007/0085811 A1* | 4/2007 | Lee | ....................... | G09G 3/3677 345/100 |
| 2011/0157263 A1* | 6/2011 | Kim | ....................... | G09G 3/3677 345/698 |
| 2011/0279358 A1* | 11/2011 | Lee | ........................ | G11C 19/28 345/87 |

(Continued)

FOREIGN PATENT DOCUMENTS

| | | |
|---|---|---|
| KR | 1020120128421 | 11/2012 |
| KR | 1020120128853 | 11/2012 |

(Continued)

*Primary Examiner* — Pegeman Karimi
(74) *Attorney, Agent, or Firm* — Cantor Colburn LLP

(57) ABSTRACT

A display device includes: a plurality of gate lines; and a gate driver including a plurality of stages which transmits a gate voltage to the gate lines, where first to fourth clock signals and first to fourth inverted clock signals having phases opposite to phases of the first to fourth clock signals, respectively, are sequentially input to each repetition unit of the stages, where each repetition unit is defined by eight consecutive stages, a carry signal output by a j-th stage is transmitted to a (j+4)th stage, and a carry signal output by the (j+4)th stage is transmitted to the j-th stage, where j is a natural number.

12 Claims, 12 Drawing Sheets

(56) References Cited

U.S. PATENT DOCUMENTS

| | | | | |
|---|---|---|---|---|
| 2013/0010916 A1* | 1/2013 | Jang | ............... | G09G 3/3677 |
| | | | | 377/64 |
| 2013/0222357 A1 | 8/2013 | Tseng et al. | | |
| 2014/0023173 A1* | 1/2014 | Miyake | ............ | G11C 19/188 |
| | | | | 377/54 |
| 2014/0354523 A1* | 12/2014 | So | ............... | G09G 3/3677 |
| | | | | 345/100 |
| 2015/0213762 A1* | 7/2015 | Xia | ............... | G09G 3/3266 |
| | | | | 345/215 |

FOREIGN PATENT DOCUMENTS

| | | |
|---|---|---|
| KR | 1020130104054 | 9/2013 |
| KR | 1020130109816 | 10/2013 |

\* cited by examiner

DISPLAY DEVICE INCLUDING GATE DRIVER INCLUDING REPETITION UNITS OF STAGES

This application claims priority to Korean Patent Application No. 10-2014-0109590 filed on Aug. 22, 2014, and all the benefits accruing therefrom under 35 U.S.C. §119, the contents of which in its entirety is herein incorporated by reference.

BACKGROUND (a) Field

Exemplary embodiments of the invention relate to a display device, and particularly relate to a display device including a display panel to which a gate driver is integrated.

(b) Description of the Related Art

A liquid crystal display is a type of display device that typically includes a display panel in which field generating electrodes such as pixel electrodes and common electrodes are provided. The liquid crystal display supplies voltages to the field generating electrodes to generate an electric field in a liquid crystal layer of the display panel, determines a direction of liquid crystal molecules of the liquid crystal layer, and controls polarization of incident light to display images. The display device may include an organic light emitting device, a plasma display device, or an electrophoretic display as well as the liquid crystal display.

The display device may include drivers such as a gate driver and a data driver. The gate driver may be patterned with a gate line, a data line and a thin film transistor, and then integrated on a display panel thereof. The gate driver integrated on the display panel without an additional gate driving chip may allow a product cost to be reduced.

The integrated gate driver typically includes a plurality of stages for generating gate voltages such as a gate-on voltage, and generates gate voltages with various waveforms based on clock signals and carry signals that are input for respective stages.

Recently, much attention has been paid to a stereoscopic image display device, and various kinds of stereoscopic image display devices and display methods have been researched. The stereoscopic image display device using binocular disparity includes a stereoscopic type using shutter glasses or polarized glasses, and an autostereoscopic type using lenticular lenses or parallax barriers. The shutter glasses type allows the display panel to time-divide left eye images and right eye images, consecutively display the left eye images and the right eye images, and selectively open and shut a left eye shutter and a right eye shutter of the shutter glasses so that the left eye images and the right eye images may be displayed to a left eye and a right eye of the user. The left eye images and the right eye images are combined in the brain of the user and are recognized as three-dimensional ("3D") images with depth perception. The stereoscopic image display device may also display two-dimensional ("2D") images in addition to the 3D stereoscopic images.

SUMMARY

Exemplary embodiments of the invention relate to a gate driver for generating a gate voltage with a waveform for improving photo-efficiency such as luminance of a stereoscopic image, and a display device including the gate driver.

Exemplary embodiments of the invention are directed to a gate driver for generating a gate voltage with a waveform for improving charging efficiency of a data voltage, and a display device including the gate driver.

An exemplary embodiment of the invention provides a display device including: a plurality of gate lines; and a gate driver including a plurality of stages which transmits a gate voltage to the gate lines, where first to fourth clock signals and first to fourth inverted clock signals having phases opposite to phases of the first to fourth clock signals, respectively, are sequentially input to each repetition unit of the stages, where each repetition unit is defined by eight consecutive stages, a carry signal output by a j-th stage is transmitted to a (j−4)th stage, and a carry signal output by the (j+4)th stage is transmitted to the j-th stage.

In an exemplary embodiment, the (j+4)th stage may output a gate-on voltage based on a carry signal output by the j-th stage, and the j-th stage may output a gate-off voltage based on a carry signal output by the (j+4)th stage.

In an exemplary embodiment, a first start pulse vertical signal may be input to the 1st and 3rd stages, a second start pulse vertical signal may be input to the 2nd and 4th stages, and a carry signal of a (j−4)th stage may be input to the j-th stage when j is greater than 4.

In an exemplary embodiment, the first to fourth clock signals may be sequentially phase-delayed by about 1 H.

In an exemplary embodiment, each clock signal may have a period of 8H and a duty ratio of about 50%.

In an exemplary embodiment, the stages may output the gate-on voltage with a width of about 4H based on a progressive scanning, and gate-on voltages transmitted to neighboring gate lines may overlap each other for about 3H.

In an exemplary embodiment, the first and second clock signals may be the same as each other, the third and fourth clock signals may be the same as each other, and the third clock signal may be phase-delayed by about 1H from the first clock signal.

In an exemplary embodiment, each clock signal may have a period of about 4H and a duty ratio of about 50%.

In an exemplary embodiment, each stage may output the gate-on voltage three times during a frame period.

In an exemplary embodiment, the frame period may be divided into first to fourth sections, and a (2p−1)th stage and a (2p)th stage, which neighbor each other, may simultaneously output a gate-on voltage in the first and fourth sections of the frame period, where p is a natural number.

In an exemplary embodiment, one of the (2p−1)th and (2p)th stages may output the gate-on voltage in the second section of the frame period, and the other of the (2p−1)th and (2p)th stages may output the gate-on voltage in the third section of the frame period.

In an exemplary embodiment, a left eye image or a right eye image may be displayed in the first to third sections of the frame period, and a black inserted image may be displayed in the fourth section of the frame period.

In an exemplary embodiment, each stage may output the gate-on voltage once during a frame period, which is divided into first and second sections, one of the (2p−1)th and (2p)th stages may output the gate-on voltage in the first section of the frame period, and the other of the (2p−1)th and (2p)th stages may output the gate-on voltage in the second section of the frame period.

In an exemplary embodiment, a carry signal output by a (j+8)th stage may be transmitted to a j-th stage.

In an exemplary embodiment, the gate driver may include n stages and eight dummy stages, where n is a natural number greater than 4, carry signals output by 1st to 4th dummy stages may be transmitted to (n−3)th to n-th stages, and carry signals output by 5th to 8th dummy stages may be transmitted to the 1st to 4th dummy stages and the (n−3)th to n-th stages.

In an exemplary embodiment, a first start pulse vertical signal may be input to the 5th and 7th dummy stages from among the dummy stages, and a second start pulse vertical signal may be input to the 6th and 8th dummy stages.

Another embodiment of the invention provides a display device including: a plurality of gate lines; and a gate driver including a plurality of stages which transmits a gate voltage to the gate lines, where first to third clock signals and first to third inverted clock signals having phases opposite to phases of the first to third clock signals, respectively, are sequentially input to each repetition unit of the stages, where each repetition unit is defined by six consecutive stages, a carry signal output by a j-th stage is transmitted to a (j+1)th stage, and a carry signal output by a (j+3)th stage is transmitted to the j-th stage, where j is a natural number.

In an exemplary embodiment, the (j+1)th stage may output a gate-on voltage based on the carry signal output by the j-th stage, and the j-th stage may output a gate-off voltage based on the carry signal output by the (j+3)th stage.

In an exemplary embodiment, a start pulse vertical signal may be input to so the 1st stage, and a carry signal of the (j−1)th stage may be input to the j-th stage when j is greater than 1.

In an exemplary embodiment, the first to third clock signals may be substantially the same as each other.

In an exemplary embodiment, each stage may output a gate-on voltage during a gate-on period having a width of about 3H, where H is a unit time corresponding to one period of a horizontal synchronization signal, and the gate-on voltage may have a high level during 1st horizontal period of the gate-on period, a low level during 2nd horizontal period of the gate-on period, and the high level during 3rd horizontal period of the gate-on period.

In exemplary embodiment described herein, the gate driver may simultaneously drive an odd-numbered gate line and an even-numbered gate line adjacent thereto, and can separately drive odd-numbered gate lines and even-numbered gate lines. Accordingly, in such embodiment, the displaying time of the black image inserted for preventing crosstalk may be substantially reduced in the case of driving for displaying the stereoscopic image, and the displaying time of the left eye image and the right eye image may be substantially increased, thereby increasing luminance of the stereoscopic image.

In such embodiments, interlaced scan driving of the display device may be effectively performed, thereby improving, for example, heat generation of the data driver.

In such embodiments, pre-charging efficiency of the data voltage can be improved by changing the output waveform of the gate-on voltage.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

Figure 1:
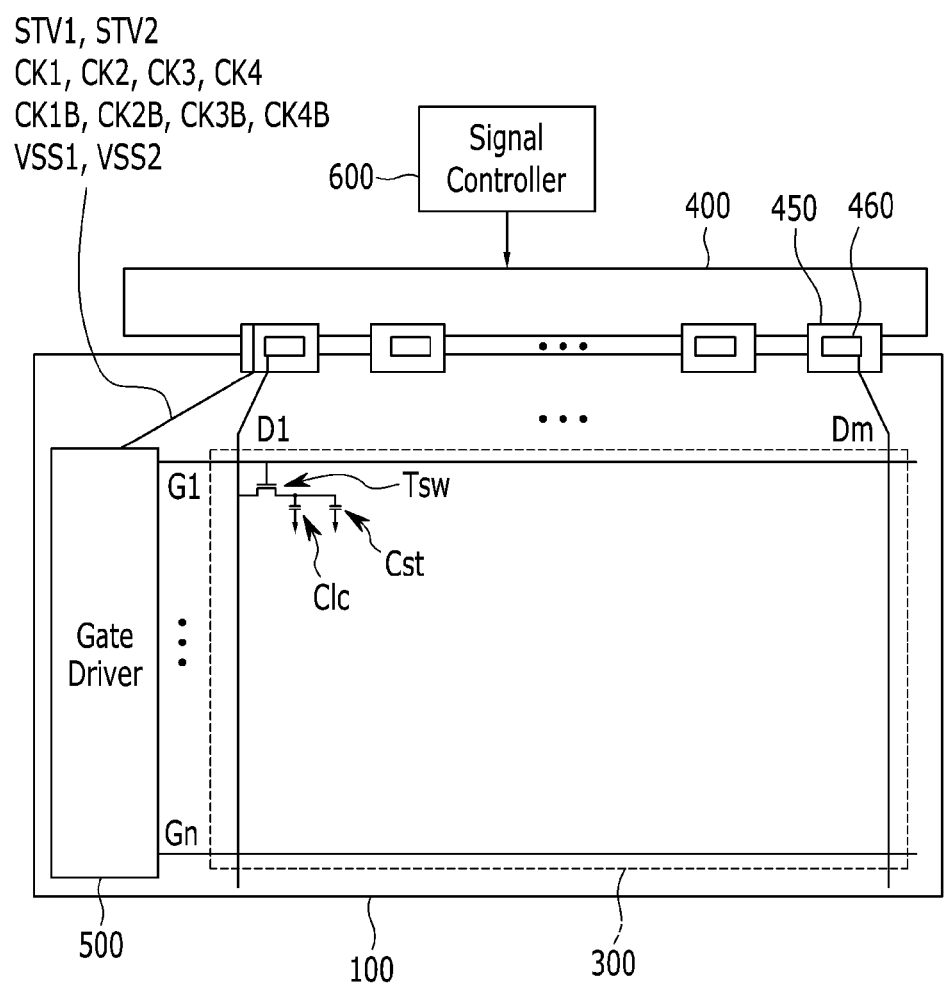
FIG. 1 is a block diagram showing an exemplary embodiment of a display panel according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of a display device according to the invention will now be described with reference to accompanying drawings.

FIG. 1 is a block diagram showing an exemplary embodiment of a display panel according to the invention.

Referring to FIG. 1, an exemplary embodiment of the display panel 100 includes a display area 300 for displaying an image, and a gate driver 500 for applying a gate voltage to gate lines (G1-Gn) of the display area 300. Data lines (D1-Dm) of the display area 300 receive a data voltage from a data driver 460 that is provided as an integrated circuit ("IC") on a flexible printed circuit board ("FPCB") 450 attached to the display panel 100. The gate driver 500 and the data driver 460 are controlled by a signal controller 600. A printed circuit board ("PCB") 400 is provided outside the FPCB 450 to transmit a signal provided by the signal controller 600 to the data driver 460 and the gate driver 500. In an exemplary embodiment, the signal provided to the gate driver 500 by the signal controller 600 includes signals such as start pulse vertical signals STV1 and STV2 and clock signals CK1, CK2, CK3, CK4, CK1B, CK2B, CK3B and CK4B, as well as signals for providing predetermined levels of low voltages VSS1 and VSS2. In an alternative exemplary embodiment, the signal may include predetermined numbers and types of start pulse vertical signals and/or clock signals, which may be variously modified, or may have a single level of low voltage.

In an exemplary embodiment, a thin film transistor is disposed on the display area 300. In one exemplary embodiment, for example, where the display panel 100 is a liquid crystal panel, the display area 300 includes a thin film transistor, a liquid crystal capacitor and a storage capacitor. In one exemplary embodiment, for example, where the display panel 100 is an organic light emitting panel, the display area 300 includes a thin film transistor and an organic light emitting diode. Hereinafter, for convenience of description, an exemplary embodiment, where the display panel 100 is the liquid crystal panel, will be described in detail, but the invention is not limited to the liquid crystal panel.

In an exemplary embodiment, a plurality of gate lines (G1-Gn) and a plurality of data lines (D1-Dm) are disposed in the display area 300, and the gate lines (G1-Gn) cross the data lines (D1-Dm) in an insulated manner.

Each pixel includes a thin film transistor Tsw, a liquid crystal capacitor Clc and a storage capacitor Cst. The thin film transistor Tsw includes a control terminal connected to a gate line, an input terminal connected to a data line, and an output terminal connected to a first terminal of the liquid crystal capacitor Clc and a first terminal of the storage capacitor Cst. A second terminal of the liquid crystal capacitor Clc is connected to a common electrode, and a second terminal of the storage capacitor Cst receives a storage voltage. The pixel of the liquid crystal panel may further include an additional structure not shown in FIG. 1.

The data lines (D1-Dm) receive a data voltage from the data driver 460, and the gate lines (G1-Gn) receive a gate voltage from the gate driver 500.

The data driver 460 is disposed or provided on an upper portion or a lower portion of the display panel 100, and is connected to the data lines (D1-Dm) extending substantially in a vertical direction. In an exemplary embodiment, as shown in FIG. 1, the data driver 460 is disposed on the upper portion of the display panel 100.

The gate driver 500 receives the start pulse vertical signals STV1 and STV2, the clock signals CK1, CK2, CK3, CK4, CK1B, CK2B, CK3B and CK4B, the first low voltage VSS1 that corresponds to a gate-off voltage, and the second low voltage VSS2 that is smaller than the gate-off voltage, the gate driver 500 generates gate voltages including the gate-on voltage and the gate-off voltage, and the gate driver 500 applies the gate voltages to the gate lines (G1-Gn). In an alternative exemplary embodiment, the gate driver 500 may be provided on the right, left, or right and left of the display panel 100.

The start pulse vertical signals STV1 and STV2, the clock signals CK1, CK2, CK3, CK4, CK1B, CK2B, CK3B and CK4B, and the low voltages VSS1 and VSS2 are applied to the gate driver 500 through the FPCB 450 that is provided near the gate driver 500. Such signals are transmitted to the FPCB 450 from an external device or the signal controller 600 through the PCB 400.

The overall structure of the display device has been described. The gate driver 500 and the gate lines (G1-Gn) will now be described in greater detail.

Figure 2:
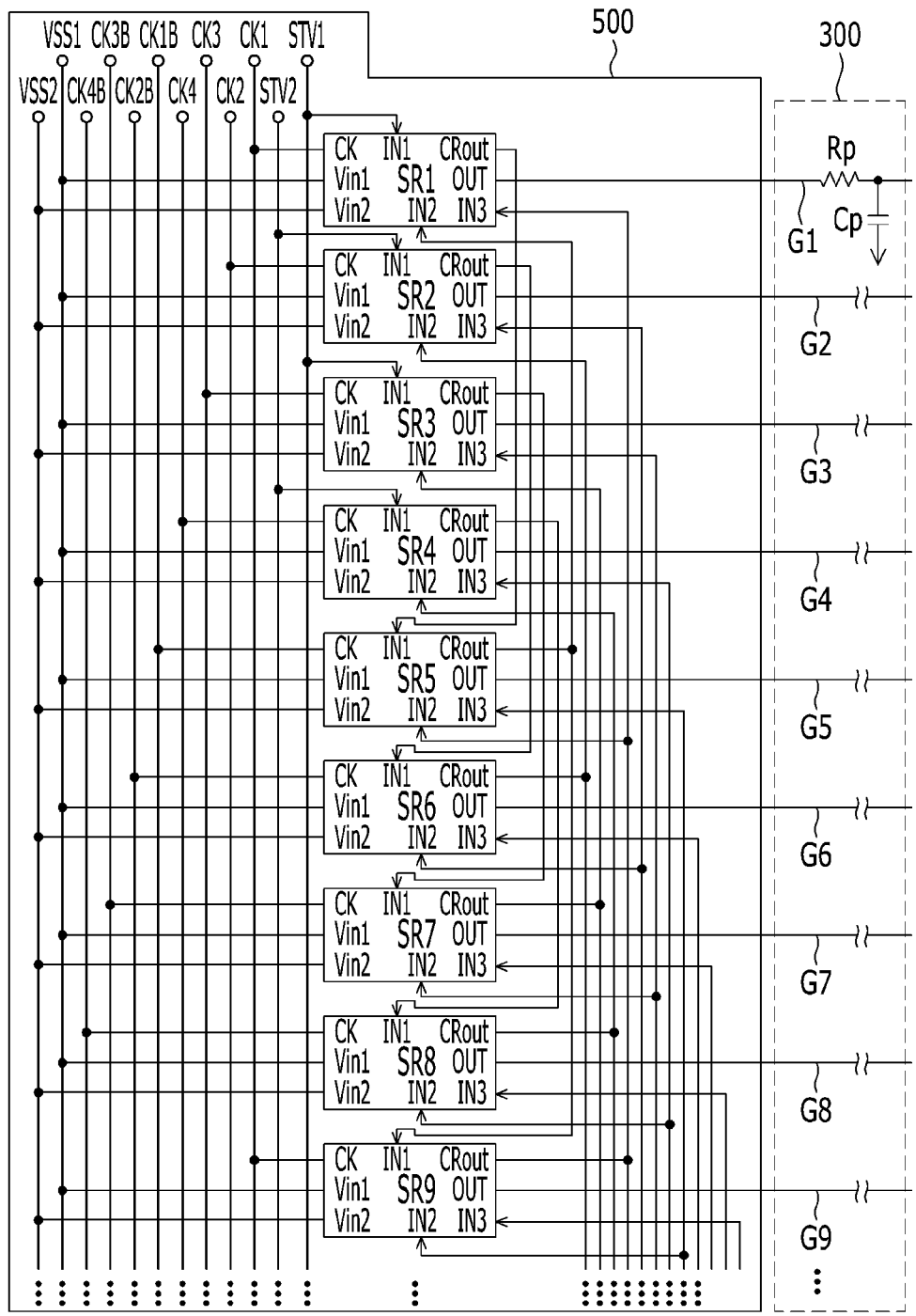
FIG. 2 is a block diagram showing an exemplary embodiment of a gate driver and gate lines shown in FIG. 1.

FIG. 2 is a block diagram showing of an exemplary embodiment of a gate driver and gate lines shown in FIG. 1.

In an exemplary embodiment, as shown in FIG. 2, the display area 300 includes a resistor Rp and a capacitor Cp. The gate lines G1-Gn, the liquid crystal capacitor Clc and the storage capacitor Cst have resistance and capacitance respectively, and may be combined and expressed as a single resistance Rp and a single capacitor Cp in a circuital manner. The value of each single resistance Rp and each single capacitor Cp represents a value corresponding to a single gate line, and is the value may be different according to a structure and a characteristic of the display area 300. In such an embodiment, the gate voltage output by a plurality of stages (SR1-SRn) is transmitted to the gate lines (G1-Gn).

In an exemplary embodiment, the gate driver 500 includes the plurality of stages (SR1-SRn) that are dependently (e.g., cascadely) connected to each other. Although the stages up to the 9th stage SR9 are shown in FIG. 2 to avoid complexity of the drawing, the gate driver 500 may include several hundred to several thousand stages depending on a resolution of the display device. The respective stages (SR1-SRn) include three input terminals IN1, IN2 and IN3, a clock signal input terminal (CK), two voltage input terminals Vin1 and Vin2, a gate voltage output terminal (OUT), and a carry signal (CR) output terminal (CRout).

In a j-th stage (SRj), which is one stage from among 1st to n-th stages, a first input terminal IN1 is connected to a carry signal output terminal (CRout) of a (j−4)th stage (SRj−4) and receives a carry signal (CRj−4) of the (j−4)th stage (SRj−4). However, since the (j−4)th stage (SRj−4) does not exist for the 1st to 4th stages (SR1-SR4), the 1st and 3rd stage SR1 and SR3 receive a first start pulse vertical signal STV1 through the first input terminal IN1, and the 2nd and 4th stages SR2 and SR4 receive a second start pulse vertical signal STV2 through the first input terminal IN1.

A second input terminal IN2 of the j-th stage (SRj) is connected to a carry signal output terminal (CRout) of the (j+4)th stage (SRj+4) and receives a carry signal (CRj+4) of the (j+4)th stage (SRj+4). A third input terminal IN3 of the j-th stage (SRj) is connected to a carry signal output terminal (CRout) of the (j+8)th stage (SRj+8) and receives a carry signal (CRj+8) of the (j+8)th stage (SRj+8). In an alternative exemplary embodiment, the third input terminal IN3 from the j-th stage (SRj) may be omitted, and the j-th stage (SRj) may not receive the carry signal (CRj+8) of the (j+8)th stage (SRj+8).

In such an embodiment, the gate driver 500 may further include dummy stages, e.g., eight dummy stages (SRn+1 to SRn+8) (not shown), such that the (n−7)th to n-th stages (SRn−7 to SRn) (not shown) connected to (n−7)th to n-th gate lines (Gn−7 to Gn) may receive carry signals (CRj+4, CRj+8) from the (j+4)th and (j+8)th stages (SRj+4, SRj+8). The dummy stages (SRn+1 to SRn+8) generate a dummy gate. In an exemplary embodiment, the gate voltages output by the stages (SR1-SRn) are transmitted through the gate lines (G1-Gn) such that the data voltage is applied to the pixel and the image is displayed, and the dummy stages (SRn+1 to SRn+8) may not be connected to the gate lines (G1-Gn) and may be connected to gate lines of the dummy pixel (not shown) that does not display the image and may not be used in displaying the image.

In an exemplary embodiment, the clock signals are input to clock signal input terminals (CK) of the stages, eight consecutive stages of the stages are defined as a stage group or a repetition unit, and first to fourth clock signals (CK1, CK2, CK3 and CK4) and first to fourth inverted clock signals (CK1B, CK2B, CK3B and CK4B) are sequentially input to each repetition unit. In one exemplary embodiment, for example, the first to fourth clock signals (CK1-CK4) are applied to the 1st to 4th stages (SR1-SR4), and the first to fourth inverted clock signals (CK1B-CK4B) are applied to the 5th to 8th stages (SR5-SR8). The first to fourth clock signals (CK1-CK4) are applied to the 9th to 12th stages (SR9-SR12), and the first to fourth inverted clock signals (CK1B-CK4B) are applied to the 13th to 16th stages (SR13-SR16). The eight stages are established as a repetition unit to apply the first to fourth clock signals and the first to fourth inverted clock signals to the clock signal input terminals (CK) of the dummy stages (SRn+1 to SRn+8). In an exemplary embodiment, the first clock signal CK1 and the first inverted clock signal CK1B are a pair of clock signals so having opposite phases to each other. In such an embodiment, the second clock signal CK2 and the second inverted clock signal CK2B, the third clock signal CK3 and the third inverted clock signal CK3B, and the fourth clock signal CK4 and the fourth inverted clock signal CK4B represent pairs of clock signals having opposite phases to each other. Therefore, four pairs of (i.e., eight) clock signals are applied to the gate driver 500, and a corresponding number of (e.g., eight) clock signal lines are disposed.

The first low voltage VSS1 corresponding to the gate-off voltage is applied to the first voltage input terminal Vin1 of each stage, and the second low voltage VSS2 that is less than the first low voltage VSS1 is applied to the second voltage input terminal Vin2 of each stage. In an alternative exemplary embodiment, the second voltage input terminal Vin2 may be omitted.

In an exemplary embodiment, the 1st stage SR1 of the gate driver 500 receives the first clock signal CK1 through the clock signal input terminal (CK), the first start pulse vertical signal STV1 through the first input terminal IN1, the first and second low voltages VSS1 and VSS2 through the first and second voltage input terminals Vin1 and Vin2, and the carry signals CR5 and CR9 from the 5th stage SR5 and 9th stage SR9 through the second and third input terminals IN2 and IN3, and the 1st stage SR1 outputs a gate-on voltage to the 1st gate line G1 through the gate voltage output terminal (OUT). The carry signal output terminal (CRout) of the 1st stage SR1 outputs the carry signal CR1 and transmits the carry signal CR1 to the first input terminal IN1 of the 5th stage SR5.

In such an embodiment, the 2nd stage SR2 of the gate driver 500 receives the second clock signal CK2 through the clock signal input terminal (CK), the second start pulse vertical signal STV2 through the first input terminal IN1, the first and second low voltages VSS1 and VSS2 through the first and second voltage input terminals Vin1 and Vin2, and the carry signals CR6 and CR10 from the 6th stage SR6 and the 10th stage SR10 (not shown) through the second and third input terminals IN2 and IN3, and outputs the gate-on voltage to the 2nd gate line G2 through the gate voltage output terminal (OUT). The carry signal output terminal (CRout) of the 2nd stage SR2 outputs the carry signal CR2 and transmits the carry signal CR2 to the first input terminal IN1 of the 6th stage SR6.

The 3rd stage SR3 of the gate driver 500 receives the third clock signal CK3 through the clock signal input terminal (CK), the first start pulse vertical signal STV1 through the first input terminal IN1, the first and second low voltages VSS1 and VSS2 through the first and second voltage input terminals Vin1 and Vin2, and the carry signals CR7 and CR11 from the 7th stage SR7 and the 11th stage SR11 (not shown) through the second and third input terminals IN2 and IN3, and outputs a gate-on voltage to the 3rd gate line G3 through the gate voltage output terminal (OUT). The carry signal output terminal (CRout) of the 3rd stage SR3 outputs the carry signal CR3 and transmits the carry signal CR3 to the first input terminal IN1 of the 7th stage SR7.

The 4th stage SR4 of the gate driver 500 receives the fourth clock signal CK4 through the clock signal input terminal (CK), the second start pulse vertical signal STV2 through the first input terminal IN1, the first and second low voltages VSS1 and VSS2 through the first and second voltage input terminals Vin1 and Vin2, and the carry signals (CR) from the 8th stage SR8 and the 12th stage SR12 (not shown) through the second and third input terminal IN2 and IN3, and outputs a gate-on voltage to the 4th gate line G4 through the gate voltage output terminal (OUT). The carry signal output terminal (CRout) of the 4th stage SR4 outputs the carry signal CR4 and transmits the carry signal CR4 to the first input terminal IN1 through the 8th stage SR8.

The 5th stage SR5 of the gate driver 500 receives the first inverted clock signal (CK1B) through the clock signal input terminal (CK), the carry signal (CR) of the 1st stage SR1 through the first input terminal IN1, the first and second low voltages VSS1 and VSS2 through the first and second voltage input terminals Vin1 and Vin2, and the carry signals CR9 and CR13 from the 9th stage SR9 and the 13th stage SR13 (not shown) through the second and third input terminals IN2 and IN3, and outputs a gate-on voltage to the 5th gate line G5 through the gate voltage output terminal (OUT). The carry signal output terminal (CRout) of the 5th stage SR5 outputs the carry signal CR5 and transmits the carry signal CR5 to the first input terminal IN1 of the 9th stage SR9 and the second input terminal IN2 of the 1st stage SR1.

Similarly, the 6th, 7th and 8th stages SR6, SR7 and SR8 receive second, third and fourth inverted clock signals CK2B, CK3B and CK4B from external devices through the clock signal input terminals (CK), the carry signals CR2, CR3 and CR4 of the 2nd, 3rd and 4th stages SR2, SR3 and SR4 through the first input terminal IN1, the first and second low voltages VSS1 and VSS2 through the first and second voltage input terminals Vin1 and Vin2, and the carry signals CR14, CR15 and CR16 from the 10th, 11th and 12th stages SR10, SR11 and SR12 (not shown) and the 14th, 15th and 16th stages SR14, SR15 and SR16 (not shown) through the second and third input terminals IN2 and IN3, and output a gate-on voltage to the 6th, 7th and 8th gate lines G6, G7 and G8 through the gate voltage output terminal (OUT). The carry signal output terminal (CRout) thereof outputs the carry signals CR6, CR7 and CR8 and transmits the carry signals CR6, CR7, and CR8 to the first input terminal IN1 of the 10th, 11th and 12th stages SR10, SR11 and SR12, respectively, and the second input terminal IN2 of the second, third and fourth stages SR2, SR3 and SR4, respectively.

In such an embodiment, as described above, the j-th stage (SRj) of the 9th to 16th stages (SR9-SR16) and the 17th to 24th stages (SR17-SR24) defining a repeated unit of the eight consecutive stages receives one of the first to fourth clock signals and the first to fourth inverted clock signals CK1-CK4 and CK1B-CK4B through the clock signal input terminal (CK), the carry signal (CRj−4) of the (j−4)th stage (SRj−4) through the first input terminal IN1, the first and second low voltages VSS1 and VSS2 through the first and second voltage input terminals Vin1 and Vin2, and the carry signals (CRj+4, CRj+8) from the (j+4)th stage (SRj+4) and the (j+8)th stage (SRj+8) through the second and third input terminals IN2 and IN3, and outputs a gate-on voltage to the j-th gate line (Gj) through the gate voltage output terminal (OUT). The carry signal output terminal (CRout) of the j-th stage (SRj) outputs the carry signal (CRj) and transmits the carry signal (CRj) to the first input terminal IN1 of the (j−4)th stage (SRj−4) and the second input terminal IN2 of the (j−8)th stage (SRj−8).

The connection structure of the stages of an exemplary embodiment of the gate driver 500 has been described with reference to FIG. 2. Hereinafter, operation of the stages of the gate driver 500 will now be described in greater detail based upon the clock signal and the carry signal with reference to FIG. 3 and FIG. 4.

Figure 3:
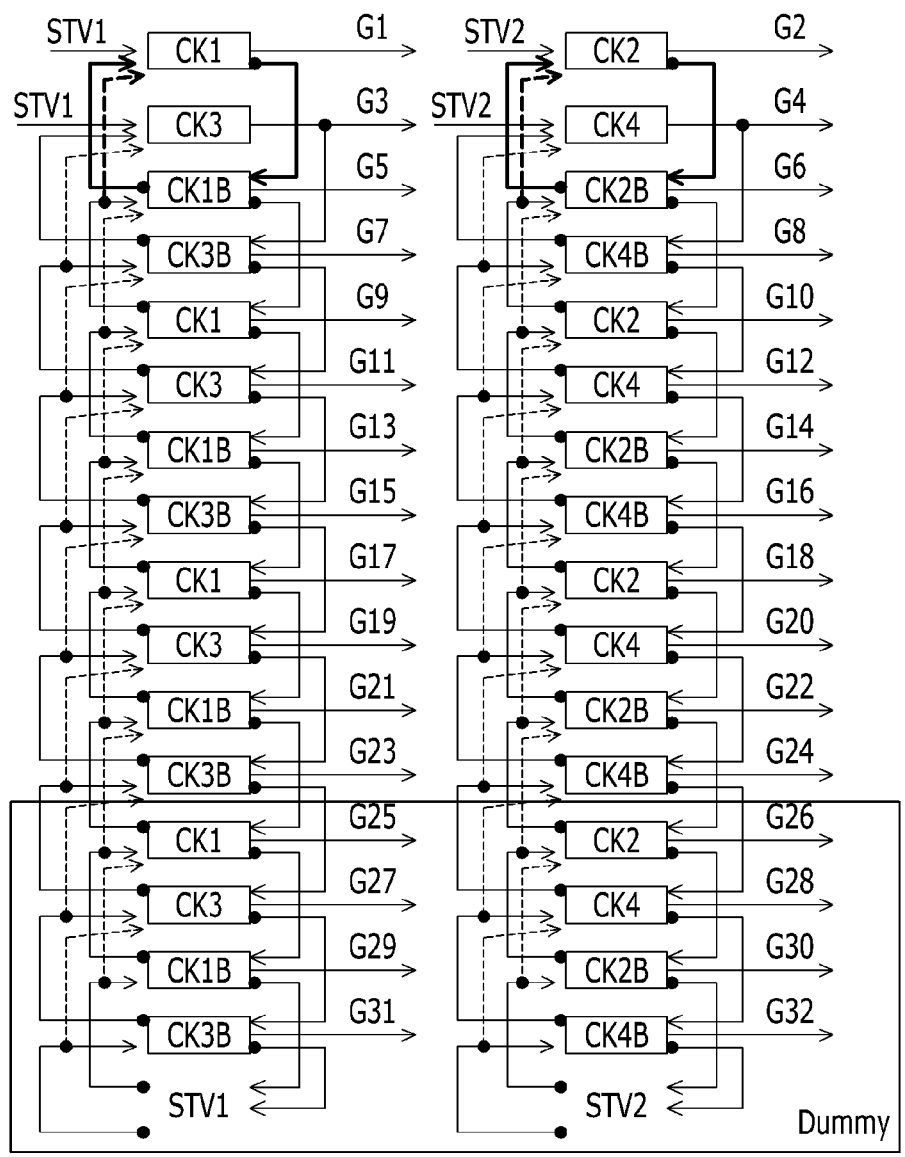
FIG. 3 is a connection relationship diagram of odd-numbered stages and even-numbered stages in an exemplary embodiment of a gate driver, according to the invention.
Figure 4:
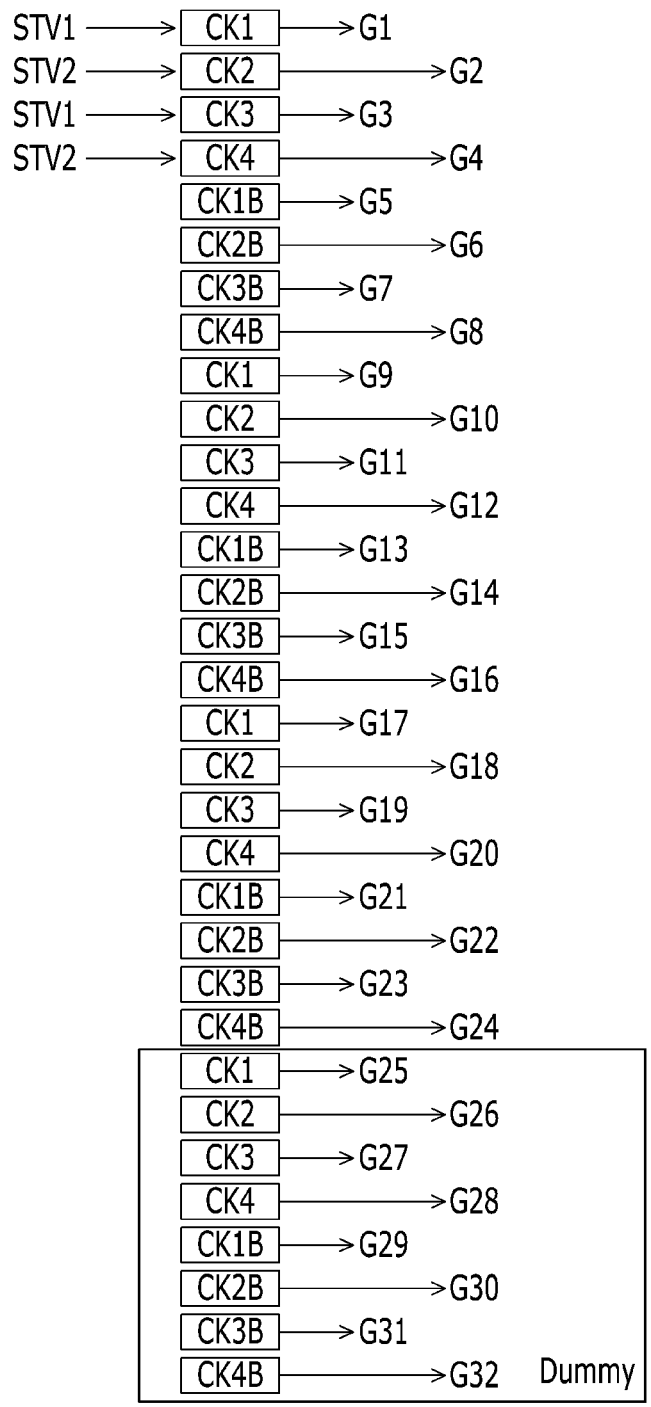
FIG. 4 is an example of an actual disposal of stages having the connection relationship shown in FIG. 3.

FIG. 3 is a diagram showing a connection relationship of odd-numbered stages and even-numbered stages of an exemplary embodiment of a gate driver according to the invention, and FIG. 4 shows an exemplary physical disposal of stages having the connection relationship shown in FIG. 3.

Referring to FIG. 3, the respective stages are shown as blocks and the clock signals input to the stages are indicated in the blocks. FIG. 3 separates the odd-numbered stages and the even-numbered stages to easily show the connection relationship of the carry signal. Actually, as shown in FIG. 4, the odd-numbered stages and the even-numbered stages may be alternately disposed in series. For simplicity of illustration, 32 stages and a gate line are shown in FIGS. 3 and 4.

As shown in the connection diagram of the odd-numbered stages on the left side of FIG. 3, the respective blocks show 1st, 3rd, 5th, . . . , 23rd stages (SR1, SR3, SR5, . . . , SR23) from top to bottom, and are connected to the 1st, 3rd, 5th, . . . , 23rd gate lines (G1, G3, G5, . . . , G23), respectively. The stages connected to the 25th, 27th, 29th and 31st gate lines G25, G27, G29 and G31 represent 1st, 3rd, 5th and 7th dummy stages. Two pairs of clock signals, that is, the first clock signal and the first inverted clock signal CK1 and CK1B, and the third clock signal and the third inverted clock signal CK3 and CK3B, from among four pairs of clock signals CK1, CK1B; CK2, CK2B; CK3, CK3B; and CK4, CK4B are input to the odd-numbered stages.

The 1st stage SR1 receives the first start pulse vertical signal STV1 to start an operation and output a gate-on voltage and a carry signal CR1, and the output gate-on voltage and the carry signal CR1 are transmitted to the 1st gate line G1 and the 5th stage SR5, respectively. The 1st stage SR1 receives the carry signal CR5 of the 5th stage SR5, and finishes the operation. In such an embodiment, in the 1st stage SR1, the gate-on voltage is switched to the gate-off voltage by the carry signal CR5 of the 5th stage SR5, and the carry signal CR1 of the 1st stage SR1 becomes a low voltage. The 1st stage SR1 may receive the carry signal CR9 output by the 9th stage SR9, and the operation of the 1st stage SR1 may be finished by the carry signal CR9 output by the 9th stage SR9.

The 3rd stage SR3 receives the first start pulse vertical signal STV1 to start an operation and output the gate-on voltage and a carry signal CR3, and the output gate-on voltage and the carry signal CR3 are transmitted to the 3rd gate line G3 and the 7th stage SR7, respectively. The 3rd stage SR3 receives the carry signal CR7 output by the 7th stage SR7 and finishes the operation. The 3rd stage SR3 may receive the carry signal CR11 output by the 11th stage SR11.

The 5th stage SR5 receives the carry signal CR1 of the 1st stage SR1 to start an operation and output a gate-on voltage and a carry signal CR5, and the output gate-on voltage is transmitted to the 5th gate line G5 and the output carry signal CR5 is transmitted to the 1st stage SR1 and the 9th stage SR9, respectively. The 5th stage SR5 receives the carry signal CR9 output by the 9th stage SR9 to finish the operation, and it can also receive a carry signal CR13 output by the 13th stage SR13.

In such an embodiment, as described above, the 1st and 3rd stages SR1 and SR3 start operations by the first start pulse vertical signal STV1, and the remaining odd-numbered stages (SR5, SR7, . . . ) each starts operations by the carry signals (CR1, CR3, . . . ) of the stages (SR1, SR3, . . . ) that are disposed by the four steps prior thereto. The odd-numbered stages (SRj) finish the operation by the carry signal CR4 of the stage (SRj+4) that is disposed by the four steps after the odd-numbered stages (SRj). The 21st stage SR21 and the 23rd stage SR23 have no stage that is disposed by the four steps after the 21st stage SR21 and the 23rd stage SR23 so they may receive carry signals from 1st and 3rd dummy stages. The odd-numbered stages (SRj) may receive the carry signal (CRj+4) of the stage (SRj+8) that is disposed by the eight steps after the odd-numbered stages (SRj), and in this case, the 21st stage SR21 and the 23rd stage SR23 may receive carry signals from 5th and 7th dummy stages. The 5th and 7th dummy stages may receive the first start pulse vertical signal STV1 and finish the operations.

In an exemplary embodiment, as shown in FIG. 3, clock signals having opposite phases to each other (e.g., phases having a phase difference of 180 degrees) are applied to the stage that is disposed by the four steps therebefore or thereafter. Therefore, in such an embodiment, the stages that receive the clock signals (CK1, CK1B; CK3, CK3B) having opposite phases transmit/receive the carry signal to/from each other.

In an exemplary embodiment, the even-numbered stages shown on the right of FIG. 3 are connected in a manner substantially the same as the connection of the odd-numbered stages. In such an embodiment, as shown in the connection diagram of the even-numbered stages of FIG. 3, the respective blocks represent 2nd, 4th, 6th, . . . , 24th stages (SR2, SR4, SR6, . . . , SR24) from top to bottom, and the 2nd, 4th, 6th, . . . , 24th stages (SR2, SR4, SR6, . . . , SR24) are connected to the 2nd, 4th, 6th, . . . , 24th gate lines (G2, G4, G6, . . . , G24), respectively. The stages connected to the 26th, 28th, 30th and 32nd gate lines (G26, G28, G30, G32) are 2nd, 4th, 6th, and 8th dummy stages. In such an embodiment, the odd-numbered stages receive the first start pulse vertical signal STV1, the first and third clock signals, and the first and third inverted clock signals (CK1, CK3, CK1B, CK3B) as externally input signals, and the even-numbered stages receive the second start pulse vertical signal STV2, the second and fourth clock signals, and the second and fourth inverted clock signals (CK2, CK4, CK2B, CK4B) as externally input signals.

The 2nd and 4th stages SR2 and SR4 start operations by the second start pulse vertical signal STV2 and the remaining even-numbered stages (SR6, SR8, . . . ) each starts operations by the carry signals (CR2, CR6, . . . ) of the stage (SR2, SR6, . . . ) that are disposed by the four steps prior thereto. The even-numbered stages (SRj) finish the operations by the carry signal (CRj+4) of the stage (SRj+4) that is disposed by the four steps after the even-numbered stages (SRj). The 22nd stage SR22 and the 24th stage SR24 have no stage that is disposed by the four steps after the 22nd stage SR22 and the 24th stage SR24 so the 22nd stage SR22 and the 24th stage SR24 may receive the carry signals from the 2nd and 4th dummy stages. The even-numbered stages (SRj) receive the carry signal (CRj+8) of the stage (CRj+8) that is disposed by the eight steps after the even-numbered stages (SRj), and in this case, the 22nd stage SR22 and the 24th stage SR24 may receive carry signals from the 5th and 8th dummy stages. The 6th and 8th dummy stages may receive the second start pulse vertical signal STV2 and finish the operations.

Regarding the even-numbered stages, the clock signals with opposite phases to each other (e.g., phases having the phase difference of 180 degrees) are applied to the stages (SRj−4, SRj+4) that are disposed by the four steps prior to or after the stage (SRj). Therefore, in such an embodiment, the stages that receive the clock signals (CK2, CK2B; CK4, CK4B) having opposite phases transmit/receive the carry signal to/from each other.

The gate driver having the stages that are connected based on the above-described manner outputs the gate voltage for progressive scan driving, simultaneous two-line driving, and interlaced scan driving based on a period of the clock signals and timings of the first and second start pulse vertical signals STV1 and STV2. Such a gate voltage of the gate driver will be described later in greater detail with reference to FIG. 6 to FIG. 8.

A detailed configuration of the stage (SRj) of the gate driver connected to a gate line will be described with reference to FIG. 5.

Figure 5:
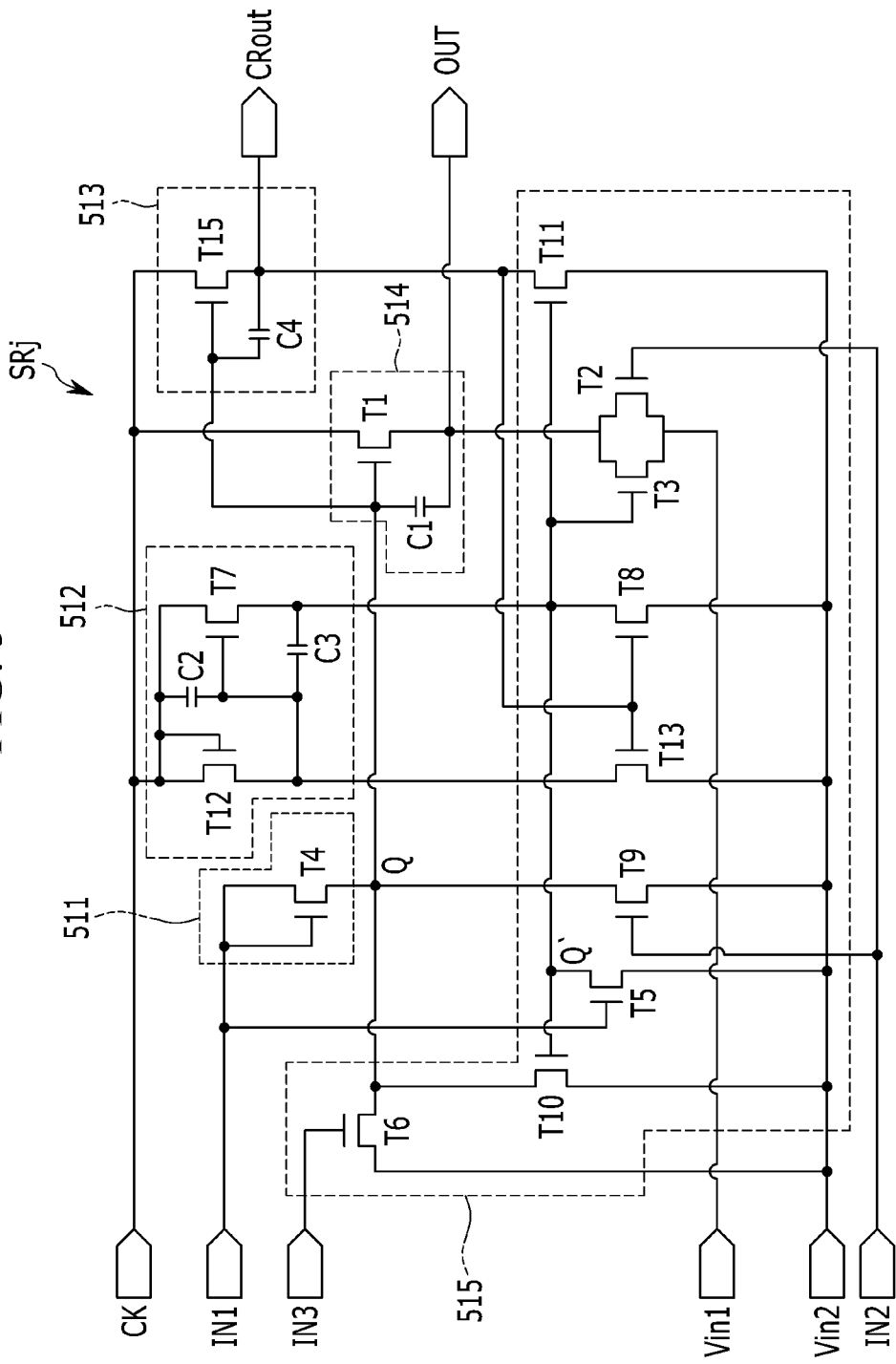
FIG. 5 is a circuit diagram of an exemplary embodiment of a stage of a gate driver, according to the invention.

FIG. 5 is a circuit diagram showing an exemplary embodiment of a stage of a gate driver, according to the invention.

In an exemplary embodiment, the stage (SRj) includes an input unit 511, a pull up driver 512, a carry signal generator 513, an output unit 514, and a pull down driver 515.

The input unit 511 includes a transistor (e.g., a fourth transistor T4). The fourth transistor T4 includes an input terminal and a control terminal that are diode-connected to the first input terminal IN1, and an output terminal connected to a Q node (or a first node). When a high signal is applied to the first input terminal IN1, the input unit 511 transmits the high signal to the Q node. The first input terminal IN1 receives one of the carry signal (CRj−4) of the (j−4)th stage (SRj−4), the first start pulse vertical signal STV1 and the second start pulse vertical signal STV2.

The pull up driver 512 includes a seventh transistor T7 and a twelfth transistor T12. The twelfth transistor T12 includes a control terminal and an input terminal that are diode-connected and receive one of the first to fourth clock signals and the first to fourth inverted clock signals (CK1-CK4, CK1B-CK4B) through the clock signal input terminal (CK), and an output terminal connected to a control terminal of the seventh transistor T7 and the pull down driver 515. The seventh transistor T7 includes an input terminal connected to the clock signal input terminal (CK), and an output terminal connected to a Q' node (or a second node). The seventh transistor T7 includes a control terminal connected to the output terminal of the twelfth transistor T12 and the pull down driver 515. A parasitic capacitor, e.g., a third capacitor C3, may be disposed or connected between the input terminal and the control terminal of the seventh transistor T7 and between the control terminal and the output terminal thereof. When the clock signal input terminal (CK) inputs a high signal, the high signal is transmitted to the control terminal of the seventh transistor T7 and the pull down driver 515 through the twelfth transistor T12 of the pull up driver 512. The high signal transmitted to the seventh transistor T7 turns on the seventh transistor T7, and the high signal applied by the clock signal input terminal (CK) is applied to the Q' node. The signal at the Q' node is an inverter signal.

The carry signal generator 513 includes a fifteenth transistor T15. The fifteenth transistor T15 includes an input terminal connected to the clock signal input terminal (CK) and that receives one of the first to fourth clock signals and the first to fourth inverted clock signals (CK1-CK4, CK1B-CK4B), a control terminal connected to an output portion of the input unit 511, that is, the Q node, and an output terminal connected to the carry signal output terminal (CRout) for outputting the carry signal (CRj). A parasitic capacitor, e.g., a fourth capacitor C4, may be disposed between the control terminal and the output terminal. The output terminal of the fifteenth transistor T15 is connected to the pull down driver 515 and receives the second low voltage VSS2 such that the carry signal (CR) has the second low voltage VSS2 as a voltage value when the carry signal (CR) is low.

The output unit 514 includes a first transistor T1 and a first capacitor C1.

The first transistor T1 includes a control terminal connected to the Q node, and an input terminal for receiving one of the first to fourth clock signals and the first to fourth inverted clock signals (CK1-CK4, CK1B-CK4B) through the clock signal input terminal (CK). The first capacitor C1 is disposed or connected between the control terminal and an output terminal, and the output terminal is connected to the gate voltage output terminal (OUT). The output terminal is also connected to the pull down driver 515 and receives a first low voltage VSS1. As a result, the voltage value of the gate-off voltage is the first low voltage VSS1. The output unit 514 outputs the gate voltage based on the voltage at the Q node and the clock signal.

The pull down driver 515 removes charges in the stage (SRj) to allow the gate-off voltage and the low voltage of the carry signal (CRj) to be effectively and stably output. In such an embodiment, the pull down driver 515 reduces a potential at the Q node, reduces a potential at the Q' node (inverter signal), reduces the voltage that is output to the carry signal (CRj), and reduces the voltage that is output to the gate line (Gj). The pull down driver 515 includes a second transistor T2, a third transistor T3, a fifth transistor T5, a sixth transistor T6, an eighth transistor to an eleventh transistor T8 to T11, and a thirteenth transistor T13.

Transistors for pulling down the Q node in the pull down driver 515 will now be described. The transistors for pulling down the Q node include the sixth transistor T6, the ninth transistor T9 and the tenth transistor T10.

In an exemplary embodiment, the sixth transistor T6 includes a control terminal connected to the third input terminal IN3 and receiving the carry signal (CRj+8) of the (j+8)th stage (SRj+8), an output terminal connected to the second voltage input terminal Vin2 and that receives the second low voltage VSS2, and an input terminal connected to the Q node. Therefore, the sixth transistor T6 is turned on by the carry signal (CRj+8) from the (j+8)th stage (SRj+8) and reduces the voltage at the Q node to the second low voltage VSS2.

The ninth transistor T9 includes a control terminal connected to the second input terminal IN2 and that receives the carry signal (CRj+4) of the (j+4)th stage (SRj+4), an output terminal connected to the second voltage input terminal Vin2, and an input terminal connected to the Q node. Therefore, the ninth transistor T9 is turned on based on the carry signal (CRj+4) from the (j+4)th stage (SRj+4) and reduces the voltage at the Q node to the second low voltage VSS2.

The tenth transistor T10 includes an input terminal connected to the Q node, an output terminal connected to the second voltage input terminal Vin2, and a control terminal connected to the Q' node (inverter signal) and that receives the inverter signal of the present stage (SRj). Therefore, the tenth transistor T10 maintains the voltage of the Q node at the second low voltage VSS2 during a period in which the inverter signal of the Q' node has a high voltage, and the tenth transistor T10 does not lower the voltage of the Q node when the voltage at the Q' node is low. When the voltage at the Q node is not lowered, the stage (SRj) outputs the gate-on voltage and the carry signal (CRj).

Transistors for pulling down the Q' node (inverter signal) in the pull down driver 515 will now be described. The transistors for pulling down the Q' node include the fifth transistor T5, the eighth transistor T8 and the thirteenth transistor T13.

In an exemplary embodiment, the fifth transistor T5 includes a control terminal connected to the first input terminal IN1, an input terminal connected to the Q' node, and an output terminal connected to the second voltage input terminal Vin2. As a result, the voltage at the Q' node is reduced to the second low voltage VSS2 based on the carry signal (CRj−4) of the (j−4)th stage (SRj−4).

The eighth transistor T8 includes a control terminal connected to the carry signal output terminal (CRout) of the present stage (SRj), an input terminal connected to the Q' node, and an output terminal connected to the second voltage input terminal Vin2. As a result, the voltage at the Q' node is reduced to the second low voltage VSS2 based on the carry signal (CRj) of the present stage (SRj).

The thirteenth transistor T13 includes a control terminal connected to the carry signal output terminal (CRout) of the present stage (SRj), an input terminal connected to the output terminal of the twelfth transistor T12 of the pull up driver 512, and an output terminal connected to the second voltage input terminal Vin2. As a result, the thirteenth transistor T13 reduces a potential inside the pull up driver 512 to the second low voltage VSS2 based on the carry signal (CRj) of the present stage (SRj), and reduces the voltage at the Q' node connected to the pull up driver 512 to the second low voltage VSS2. In such an embodiment, the thirteenth transistor T13 discharges internal charges of the pull up driver 512 toward the second low voltage VSS2, but effectively prevents the voltage at the Q' node from being pulled up since the pull up driver 512 is connected to the Q' node, thereby indirectly allowing the voltage at the Q' node to be reduced to the second low voltage VSS2.

The eleventh transistor T11 of the pull down driver 515 for lowering the voltage output to the carry signal (CRj) will now be described. The eleventh transistor T11 includes a control terminal connected to the Q' node, an input terminal connected to the carry signal output terminal (CRout), and an output terminal connected to the second voltage input terminal Vin1. The eleventh transistor T11 reduces the voltage of the carry signal output terminal (CRout) to the second low voltage VSS2 when the voltage at the Q' node is high, such that the carry signal (CR) is switched to the low level.

Transistors for reducing the voltage output to the gate line (Gj) in the pull down driver 515 will now be described. The transistors for reducing the voltage output to the gate line (Gj) include the second transistor T2 and the third transistor T3.

In an exemplary embodiment, the second transistor T2 includes a control terminal connected to the second input terminal IN2, an input terminal connected to the gate voltage output terminal (OUT), and an output terminal connected to the first voltage input terminal Vin1. As a result, when the carry signal (CRj+4) of the (j+4)th stage (SRj+4) is output, the second transistor T2 changes the output gate voltage into the first low voltage VSS1.

The third transistor T3 includes a control terminal connected to the Q' node, an input terminal connected to the gate voltage output terminal (OUT), and an output terminal connected to the first voltage input terminal Vin1. As a result, when the voltage at the Q' node is high, the third transistor T3 changes the output gate voltage into the first low voltage VSS1.

In an exemplary embodiment, the pull down driver 515 reduces the voltage of a gate voltage output terminal (OUT) to the first low voltage VSS1, and reduces the voltages at the Q node, the Q' node and the carry signal output terminal (CRout) to the second low voltage VSS2 that is lower than the first low voltage VSS1. As a result, the gate-on voltage and the high voltage of the carry signal (CRj) may have voltages having substantially the same level as each other, and the gate-off voltage and the low voltage of the carry signal (CR) may have voltages of different levels from each other. In such an embodiment, the gate-off voltage has the first low voltage VSS1, and the low voltage of the carry signal (CR) has the second low voltage VSS2.

The gate voltage and the carry signal (CRj) may have various voltage values. In one exemplary embodiment, for example, the gate-on voltage may be about 25 volts (V), the gate-off voltage and the first low voltage VSS1 may be about −5 V, the high voltage of the carry signal (CRj) may be about 25 V, and the low voltage of the carry signal (CRj) and the second low voltage VSS2 may be about −10 V.

In an exemplary embodiment, as described above, in the stage (SRj), the carry signal generator 513 and the output unit 514 are operated by the voltage at the Q node to output the high voltage of the carry signal (CRj) and the gate-on voltage, the carry signal (CRj) of the present stage (SRj) is lowered to the second low voltage VSS2 from the high voltage by the carry signals (CRj+4, CRj+8) of the (j+4)th and (j+8)th stages (SRj+4, SRj+8), and the gate-on voltage is reduced to the first low voltage VSS1 to be the gate-off voltage. In an exemplary embodiment, the stage (SRj) reduces the voltage at the Q node to the second low voltage VSS2 by the carry signal (CRj+8) of the (j+8)th stage (SRj+8) as well as the carry signal (CRj+4) of the (j+4)th stage (SRj+4) to be driven with less power consumption. The second low voltage VSS2 is lower than the first low voltage VSS1 that is a gate-off voltage such that the transistor included in the stage (SRj) does not generate a leakage current when the carry signal applied by another stage includes a ripple or noise, and power consumption may be thereby reduced. The carry signal (CRj+8) of the (j+8)th stage (SRj+8) input to the stage (SRj) may allow operation reliability of the stage (SRj) to increase when the thin film transistor is degraded.

A waveform of input signals and output signals of an exemplary embodiment of the gate driver will now be described with reference to FIG. 6 and FIG. 7.

Figure 6:
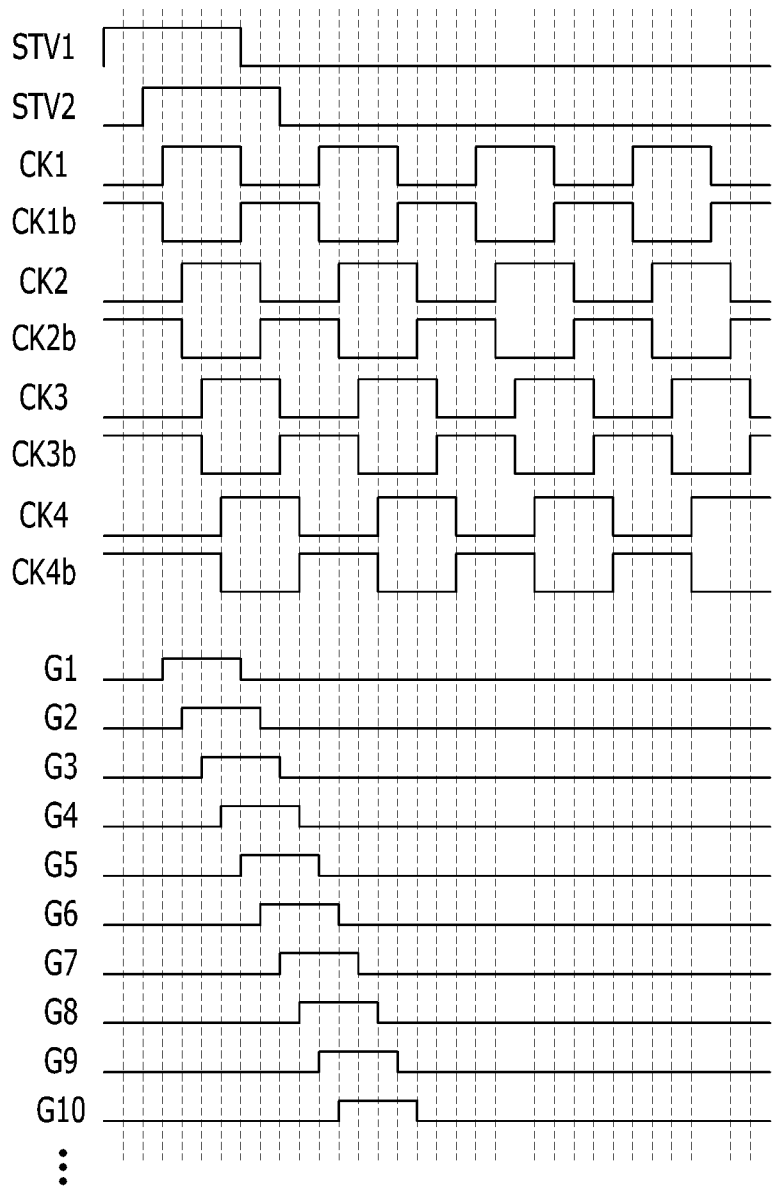
FIG. 6 is a waveform diagram of major signals that are input to/output from the gate driver shown in FIG. 3 when a two-dimensional ("2D") image is displayed.
Figure 7:
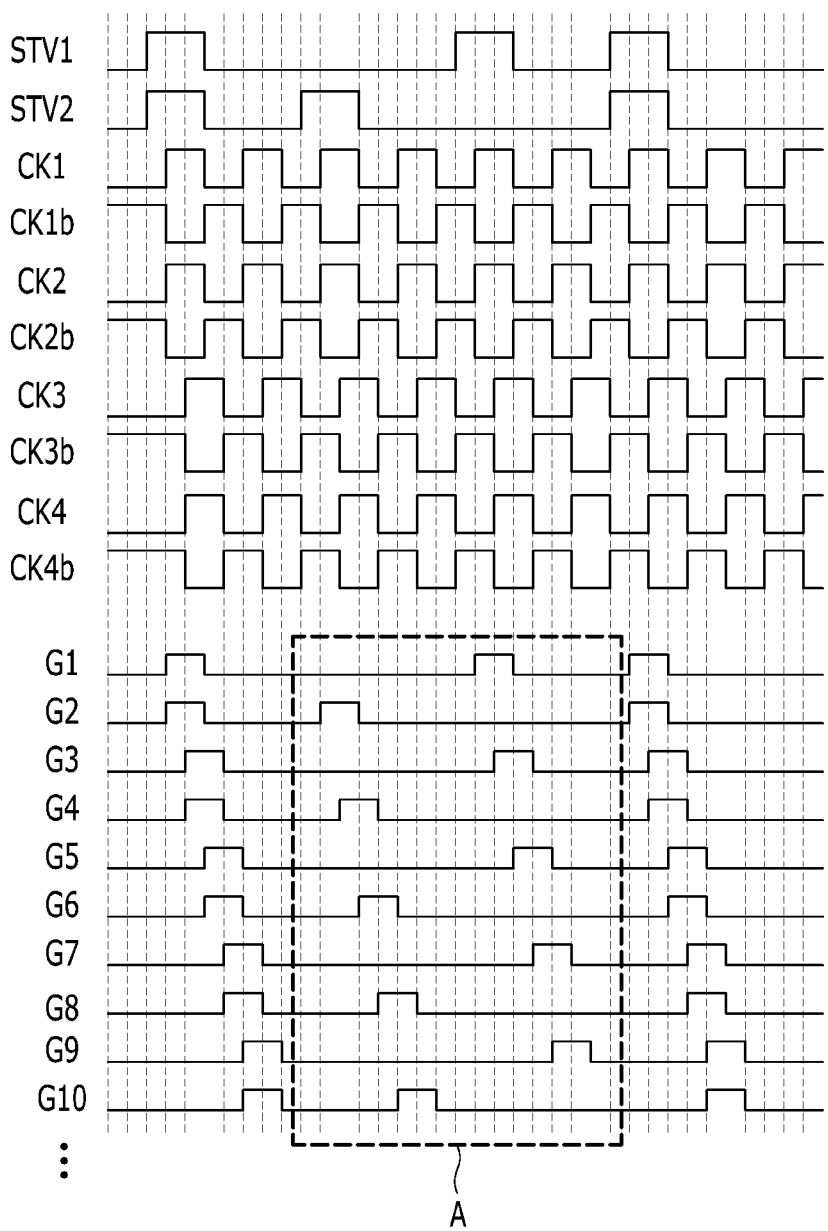
FIG. 7 is a waveform diagram of major signals that are input to/output from the gate driver shown in FIG. 3 when a stereoscopic image is displayed.

FIG. 6 is a waveform diagram of major signals that are input to/output from a gate driver shown in FIG. 3 when a two-dimensional ("2D") image is displayed, and FIG. 7 shows a waveform diagram of major signals that are input to/output from a gate driver shown in FIG. 3 when a stereoscopic image is displayed.

In FIG. 6 and FIG. 7, a horizontal direction represents a time axis and a gap between dotted lines indicates the time period of one horizontal period, i.e., 1H. Here, H is a unit time corresponding to one period of the horizontal synchronization signal. In an exemplary embodiment of the invention, waveforms of input/output signals when the 2D image is displayed may be different from waveforms of input/output signals when the stereoscopic image is displayed.

Regarding the signal when the 2D image is displayed, the first to fourth clock signals (CK1-CK4) from among the clock signals that are input to the gate driver have a duty ratio of about 50% and a pulse width (high level) of 4H, and thus have a period of 8H. The first to fourth clock signals (CK1-CK4) are sequentially phase-delayed by 1H. The first to fourth inverted clock signals (CK1B-CK4B) have phases opposite to the phases of the first to fourth clock signals (CK1-CK4).

When the clock signals (CK1-CK4, CK1B-CK4B) are applied to the stage of the gate driver connected as shown in FIG. 3, each stage receives and outputs corresponding carry signals and outputs the gate-on voltage sequentially phase-delayed by 1H to the gate lines (G1-Gn). In one exemplary embodiment, for example, the first start pulse vertical signal STV1 and the second start pulse vertical signal STV2 shown in FIG. 6 are applied to the 1st and 3rd stages SR1 and SR3 and the 2nd and 4th stages SR2 and SR4

In an exemplary embodiment, as shown in FIG. 6, the first and second start pulse vertical signals STV1 and STV2 each has one-frame period. As described with reference to FIG. 3, the first and second start pulse vertical signals STV1 and STV2 may have a high level in the earlier period of the frame to start the operations of the 1st and 3rd stages SR1 and SR3 and the 2nd and 4th stages SR2 and SR4.

When the 2D image is displayed, the gate driver applies the gate-on voltage to the gate line based on the progressive scan method. In an exemplary embodiment, a width of the clock signal is 4H and a width of the gate-on voltage is 4H. The gate-on voltage between the adjacent gate lines is phase-delayed by 1H and overlaps each other for 3H. Therefore, a precharging period of the data voltage for each pixel of the display device may be 3H.

Referring to FIG. 7, when the stereoscopic image is displayed, the timings of the clock signals (CK1-CK4, CK1B-CK4B) and the start pulse vertical signals STV1 and STV2 are changed to be different from the case of displaying the 2D image.

The first to fourth clock signals (CK1-CK4) have the duty ratio of about 50% and a pulse width of 2H so each of the first to fourth clock signals (CK1-CK4) may have a period of 4H. The first and second clock signals CK1 and CK2 are substantially the same as each other, and the third and fourth clock signals CK3 and CK4 are substantially the same as each other. The third clock signal CK3 is phase-delayed by 1H compared to the first clock signal CK1. The first to fourth inverted clock signals (CK1B-CK4B) have phases opposite to the phases of the first to fourth clock signals (CK1-CK4). Therefore, the first and second inverted clock signals (CK1B, CK2B) are substantially the same as each other, and the third and fourth inverted clock signal (CK3B, CK4B) are substantially the same as each other.

When the clock signal is input to the gate driver shown in FIG. 3, the odd-numbered stages start operations by the first start pulse vertical signal STV1, transmit and receive corresponding carry signals, and output the gate-on voltage that is sequentially phase-delayed by 1H, and the even-numbered stages start operations by the second start pulse vertical signal STV2, transmit and receive corresponding carry signals, and output the gate-on voltage that is sequentially phase-delayed by 1H.

The first start pulse vertical signal STV1 applied to the 1st and 3rd stages SR1 and SR3 and the second start pulse vertical signal STV2 applied to the 2nd and 4th stages SR2 and SR4 have the high level three times during a frame period, e.g., during one frame period or every frame period. In one exemplary embodiment, for example, when one frame period is divided into four sections, the first start pulse vertical signal STV1 has a high level in the earlier stages of the first section, the third section and the fourth section, and the second start pulse vertical signal STV2 has a high level in the earlier stages of the first section, the second section and the fourth section. Widths of the respective sections are variable by a gap between the high level of the first and second start pulse vertical signals STV1 and STV2. In the respective sections, the stages of the gate driver output the gate-on voltage to the even-numbered and/or odd-numbered gate line based on the first and/or second start pulse vertical signal STV1 and/or STV2. Part of each section may temporally overlap the neighboring section. In one exemplary embodiment, for example, the gate-on voltage of the second section may start to be output before the entire stages finish outputting the gate-on voltage in the first section.

In an exemplary embodiment, when the first and second start pulse vertical signals STV1 and STV2 and the first to fourth clock signals and first to fourth inverted clock signals (CK1-CK4, CK1B-CK4B) are applied to the stages of the gate driver connected as shown in FIG. 3, the stages transmit and receive corresponding carry signals, and output the gate-on voltage that is sequentially phase-delayed by 1H to the gate lines (G1-Gn) per two gate lines. In such an embodiment, the gate-on voltages with the same timing or phase are applied to the (2p−1)th gate line and the (2p)th gate line, and the gate-on voltage that is phase-delayed by 1H from the gate-on voltage applied to the (2p)th gate line is applied to the (2p+1)th gate line (here, p is a natural number). In such an embodiment, as shown in FIG. 7, since the first start pulse vertical signal STV1 has a high level in the third section of one frame period and the second start pulse vertical signal STV2 has a high level in the second section, the even-numbered (2p)th stages output the gate-on voltage that is sequentially delayed by 1H from one another in the second section, and the odd-numbered (2p−1)th stages output the gate-on voltage that is sequentially delayed by 1H from one another in the third section.

In a conventional display panel, when the stereoscopic image is displayed, the gate-on voltage may be applied to the gate lines based on the progressive scan method, and a black image (or an image expressing constant luminance) is inserted between the left eye image and the right eye image to prevent crosstalk therebetween. In such a conventional display panel, luminance loss is increased as the black image becomes wider. In an exemplary embodiment, the gate-on voltage applied to the gate line may increase the displaying time of the left eye image and the right eye image, compared to a conventional display panel, where the gate-on voltage are applied to the gate lines based on the progressive scan method, thereby increasing photo-efficiency of the stereoscopic image, which will now be described with reference to FIG. 8.

Figure 8:
FIG. 8 is a conceptual diagram showing a time-divided left eye image, a black image and a right eye image that may be displayed based on the signals shown in FIG. 7.

FIG. 8 is a conceptual diagram showing a time-divided left eye image, a black image and a right eye image that may be displayed based on the signals shown in FIG. 7.

Referring to FIG. 8, in an exemplary embodiment, the left eye image (L) and the right eye image (R) are alternately displayed for each frame, which is repeated while the stereoscopic image is displayed. Because of such alternate displaying of the left eye image (L) and the right eye image (R), the left eye image (L) and the right eye image (R) may be displayed with the frequency of 120 Hz (i.e., a period of $\frac{1}{120}$ seconds) when a source image is a 60-Hz image. In the frame displaying of the left eye image (L), left eye image data (1, 3, 5, . . . ) corresponding to the pixels connected to the (2p−1)th gate lines are input to the pixels connected to the (2p−1)th and the (2p)th gate lines in the first section. In the second section, left eye image data (2, 4, 6, . . . ) corresponding to the pixels connected to the (2p)th gate line are input to the pixels connected to the (2p)th gate line, and in the third section, the left eye image data (1, 3, 5, . . . ) corresponding to the pixels connected to the (2p−1)th gate line are input to the pixels connected to the (2p−1)th gate line. In the fourth section, black image data (b) are input to the pixels connected to the (2p−1)th and the (2p)th gate line. In an exemplary embodiment, as described above, in the frame displaying the right eye image (R), right eye image data and black image data are input to the pixels connected to the (2p−1)th and (2p)th gate line throughout the first to fourth sections. In an exemplary embodiment, input order of the image data may be variously modified.

In an exemplary embodiment, when the left eye and right eye image data and the black image data are input to the display device based on the gate-on voltage output by the gate driver, a time difference between the gate-on voltage applied to the first gate line G1 and the gate-on voltage applied to the last gate line (Gn) entire pixel is reduced to increase the period for displaying the left eye and right eye images and reduce the period for displaying the black image data. In one exemplary embodiment, for example, when the device is driven by the conventional progressive scan method and the time difference may be about 4 milliseconds (ms), the time difference is reduced to about 2 ms in such an embodiment of the invention.

In FIG. 8, a shaded region represents a period in which a backlight light source such as a light emitting diode ("LED") is turned on. The period may be synchronized with a period in which a left eye or right eye shutter of the shutter glasses is turned on, so the image displayed to the display device during the period may be input to the left eye or the right eye of a watcher. When the period for displaying the black image data (b) is reduced, the left eye image and the right eye image are not mixed but are input to his left eye and right eye while generating no crosstalk between them.

In an exemplary embodiment, as described above, one frame period may be divided into four sections, the gate-on voltage is simultaneously applied to two neighboring gate lines in the first section, the gate-on voltage is applied to the even-numbered gate lines in the second section, and the gate-on voltage is applied to the odd-numbered gate lines in the third section. In the fourth section that is a residual time frame, when the gate-on voltage is simultaneously applied to two neighboring gate lines and a black image is inserted, the period for displaying the black image is reduced and the period for displaying the left eye image and the right eye image is increased. As a result, the crosstalk between the left eye image and the right eye image is effectively prevented, and photo-efficiency such as luminance of the stereoscopic image is substantially increased.

In an exemplary embodiment, as described above, the two lines may be concurrently driven based on four pairs of clock signals. In an alternative exemplary embodiment, four lines may be concurrently driven using eight pairs of clock signals. In such embodiments, when a number of clock signals is increased, n/2 lines may be simultaneously driven using n pairs of clock signals, and the interlaced scan driving may be performed together with/independent from the simultaneous driving. Performance of interlaced scan driving independent from simultaneous driving will be described later in detail.

In an exemplary embodiment, as shown by a region indicated with a dotted line box (A) in FIG. 7, the gate-on voltage is applied to the (2p)th gate line in the second section, and the gate-on voltage is applied to the (2p−1)th gate line in the third section. In such an embodiment, the second section and the third section correspond to one frame period or half frame period, respectively. The gate-on voltage in the first section outside the dotted line box (A) and the gate-on voltage in the fourth section are not generated nor output at corresponding timing when both of the high-level first and second start pulse vertical signals STV1 and STV2 are not applied. In such an embodiment, a predetermined scan driving method, for example, the interlaced scan driving method for applying the gate-on voltage to the even-numbered (or odd-numbered) gate lines in one frame period and applying the gate-on voltage to the odd-numbered (or even-numbered) gate lines in the next frame, may be effectively performed by controlling the timing for applying the first and second start pulse vertical signals STV1 and STV2.

The interlaced scan driving method reduces a polarity change period of the data voltage applied from the data driver, thereby improving a heating problem of the data driver. In one exemplary embodiment, For example, when row inversion (or dot inversion) driving is to be performed in a structure in which pixels of one column are connected to the same data line, the polarity of the data voltage is set to be inverted for each 1H in the case of the sequential driving. However, in an exemplary embodiment, where the interlaced scan driving is performed, since the polarity may be inverted for each row by applying a data voltage with one polarity when applying the gate-on voltage to the odd-numbered gate lines, and applying a data voltage with opposite polarity when applying the gate-on voltage to the even-numbered gate lines, the polarity inversion period of the data voltage is substantially reduced. In such an embodiment, the interlaced scan driving method may be used to display the stereoscopic image as well as the 2D image by a polarized stereoscopic display device.

An alternative exemplary embodiment, where three pairs of clock signals and a start pulse vertical signal are applied to a stage of a gate driver, will hereinafter be described.

Figure 9:
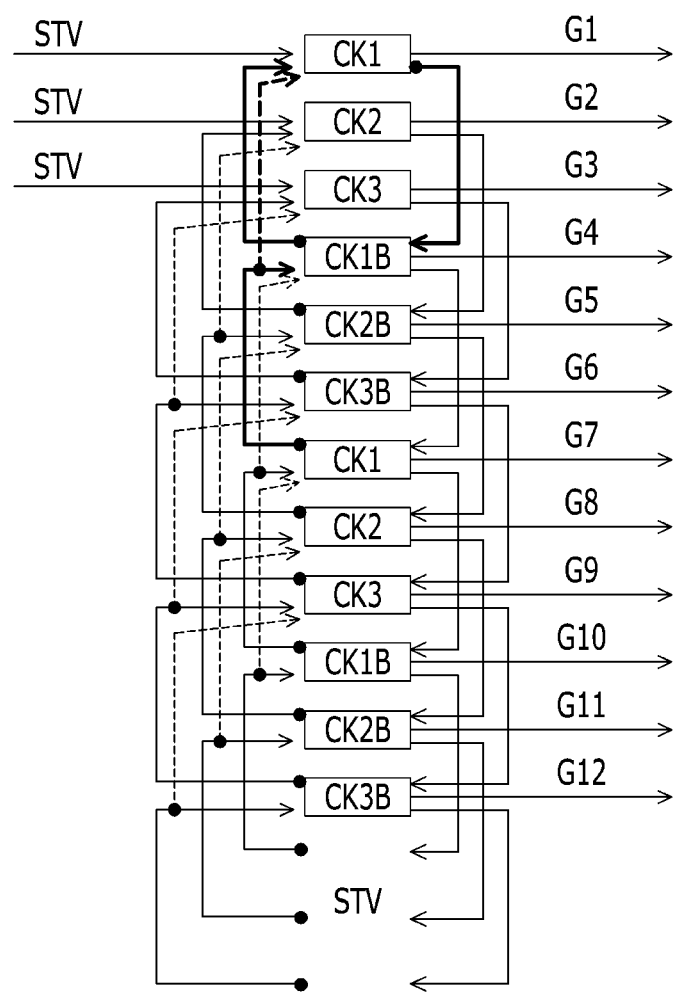
FIG. 9 is a block diagram showing a connection relationship of stages of an exemplary embodiment of a gate driver according to the invention.
Figure 10:
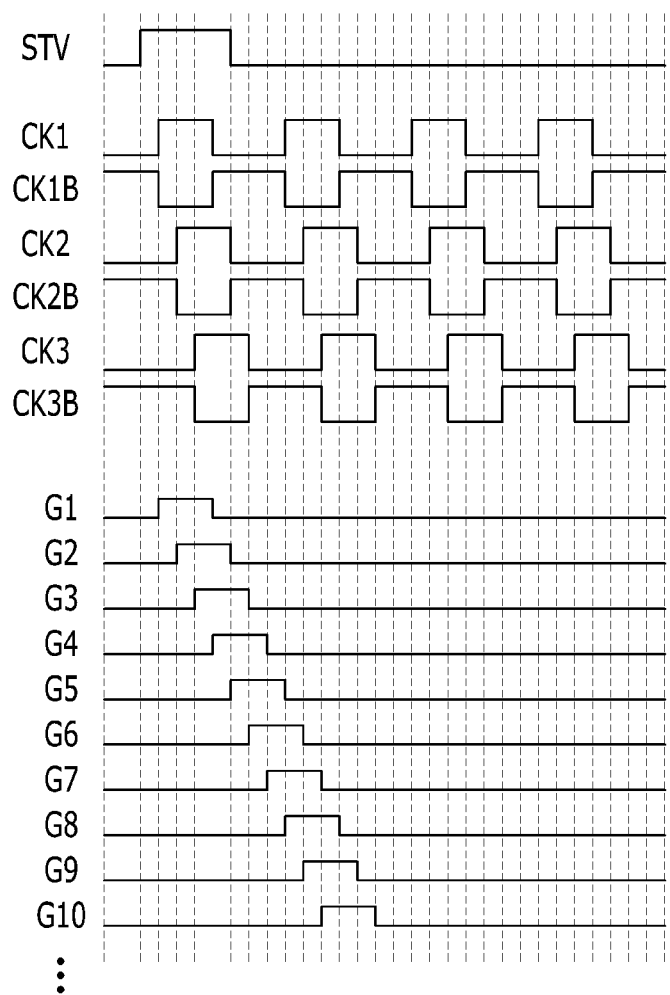
FIG. 10 is a waveform diagram of major signals that are input to/output from a gate driver shown in FIG. 9.

FIG. 9 is a block diagram showing a connection relationship of stages of an exemplary embodiment of a gate driver according to the invention, and FIG. 10 is a waveform diagram of major signals that are input to/output from the gate driver shown in FIG. 9.

Referring to FIG. 9, the respective stages are shown with blocks, and the clock signals input to the stages are indicated in the blocks. The respective blocks show 1st, 2nd, . . . , 12th stages from top to bottom, and are connected to the 1st, 2nd, . . . , 12th gate lines (G1, G2, . . . , G12). For convenience of illustration and description, twelve stages are shown in FIG. 9, but not being limited thereto. In an exemplary embodiment, the gate driver may include many more stages, for example, hundreds or thousands of stages depending on the resolution of the display device, and the gate driver may further include dummy stages. In such an embodiment, as shown in FIG. 9, the first to third clock signals CK1, CK2 and CK3 and the first to third inverted clock signals CK1B, CK2B and CK3B are sequentially input to each stage from the first stage with six consecutive stages as a repetition unit. The respective stages may have a circuit structure substantially the same as the circuit structure described above with reference to FIG. 5.

The 1st to 3rd stages (SR1-SR3) receive the start pulse vertical signal STV to start operations thereof, and each outputs a gate-on voltage and a carry signal. The gate-on voltage and the carry signal CR1 output form the 1st stage SR1 are transmitted to the 1st gate line G1 and the 4th stage SR4. The 1st stage SR1 receives the carry signal CR4 from the 4th stage SR4 and finishes the operation thereof. In such an embodiment, in the 1st stage SR1, the gate-on voltage becomes a gate-off voltage and the carry signal CR1 becomes a low voltage by the carry signal CR4 of the 4th stage SR4. The 1st stage SR1 may receive the carry signal CR7 from the 7th stage SR7, and the gate-on voltage becomes a gate-off voltage and the carry signal CR1 becomes a low voltage by the carry signal CR7. The gate-on voltage and the carry signal CR2 output by the 2nd stage SR2 are transmitted to the 2nd gate line G2 and the 5th stage SR5. The 2nd stage SR2 receives the carry signal CR5 from the 5th stage SR5 to finish the operation thereof, and receives the carry signal CR8 from the 8th stage SR8. The gate-on voltage and the carry signal CR3 output by the 3rd stage SR3 are transmitted to the 3rd gate line G3 and the 6th stage SR6. The 3rd stage SR3 receives the carry signal CR6 from the 6th stage SR6 to finish the operation thereof, and receives the carry signal CR9 from the 9th stage SR9.

The 4th stage SR4 starts an operation not by the first start pulse vertical signal STV1 but by the carry signal. That is, the 4th stage SR4 receives the carry signal CR1 from the 1st stage SR1 to start an operation thereof, and outputs a gate-on voltage and a carry signal CR4. The output gate-on voltage and the carry signal CR4 are transmitted to the 4th gate line G4 and the 7th stage SR7. The 4th stage SR4 receives the carry signal CR7 from the 7th stage SR7 to finish the operation thereof, and receives a carry signal CR10 from the 10th stage SR10.

In such an embodiment, as described above, the 1st to 3rd stages (SR1-SR3) start the operations thereof by the start pulse vertical signal STV, and the other stages (SR4, SR5, . . . ) start the operations by the carry signal (CRj−3) of the stage (SRj−3) that is disposed by the three steps therebefore. All stages finish the operations by the carry signal (CRj+4) of the stage (SRj+4) that is disposed by the four steps thereafter. The last three stages from among all stages, which have no stage that is disposed by the three steps thereafter, may receive the carry signal from 1st to 3rd dummy stages (not shown). In such an embodiment, all stages may receive the carry signal (CRj+6) from the stage (SRj+6) that is disposed by the six steps thereafter, and in this case, the last three stages may receive a carry signal from 4th to 6th dummy stages (not shown). The 4th to 6th dummy stages may receive the start pulse vertical signal STV and finish the operations thereof.

As shown in FIG. 9, clock signals having opposite phases to each other (i.e., having the phase difference of 180 degrees) are applied to the stages (SRj−3, SRj+3) that are disposed by the three steps therebefore or thereafter. Therefore, the stages receiving the clock signals (CK1, CK1B; CK2, CK2B; CK3, CK3B) having opposite phases to each other transmit and receive the carry signal to and from each other.

In an exemplary embodiment, as shown in FIG. 10, the first to third clock signals (CK1-CK3) may have a duty ratio of about 50%, have a pulse width of 3H, and be sequentially phase-delayed by 1H from one another. The first to third inverted clock signals (CK1B-CK3B) have opposite phases to those of the first to third clock signals (CK1-CK3). When the clock signals (CK1-CK3, CK1B-CK3B) are applied to the stages of the gate driver connected as shown in FIG. 9, the respective stages transmit and receive the carry signal, and output the 3H-width gate-on voltage that is sequentially phase-delayed by 1H to the gate lines.

In an exemplary embodiment, as shown in FIG. 10, the gate-on voltages applied to the adjacent gate lines overlap each other for about 2H, such that the data voltage may be precharged to the pixel for about 2H. That is, during a gate-on period having a width of about 3H, the pixel is precharged with the data voltage of the adjacent pixels for about 2H, and the pixel is charged with the data voltage of the pixel for about 1H. In such an embodiment, when a time period for the pixel to be charged with the data voltage of the pixel is defined to be 3rd horizontal period of the gate-on period, the pixel is precharged for 1st and 2nd horizontal period of the gate-on period. When the data voltage is driven to be inverted for each 1H, the polarities of the data voltage for the 1st and 3rd horizontal periods are substantially the same as each other, but the polarities of the data voltage for 2nd horizontal period may be opposite to the polarities of the data voltage for the 1st and 3rd horizontal period. Therefore, in an alternative exemplary embodiment, where the precharging may not be effectively preformed based on the inversion driving method of the data voltage, the waveform of the gate-on voltage may be modified to allow the pixel to be precharged for the 3rd horizontal period and not to be precharged for the 2nd horizontal period. Hereinafter, an alternative exemplary embodiment, where the gate-on voltage that is effectively precharged for 2nd horizontal period is output to the stages, will now be described with reference to FIG. 11.

Figure 11:
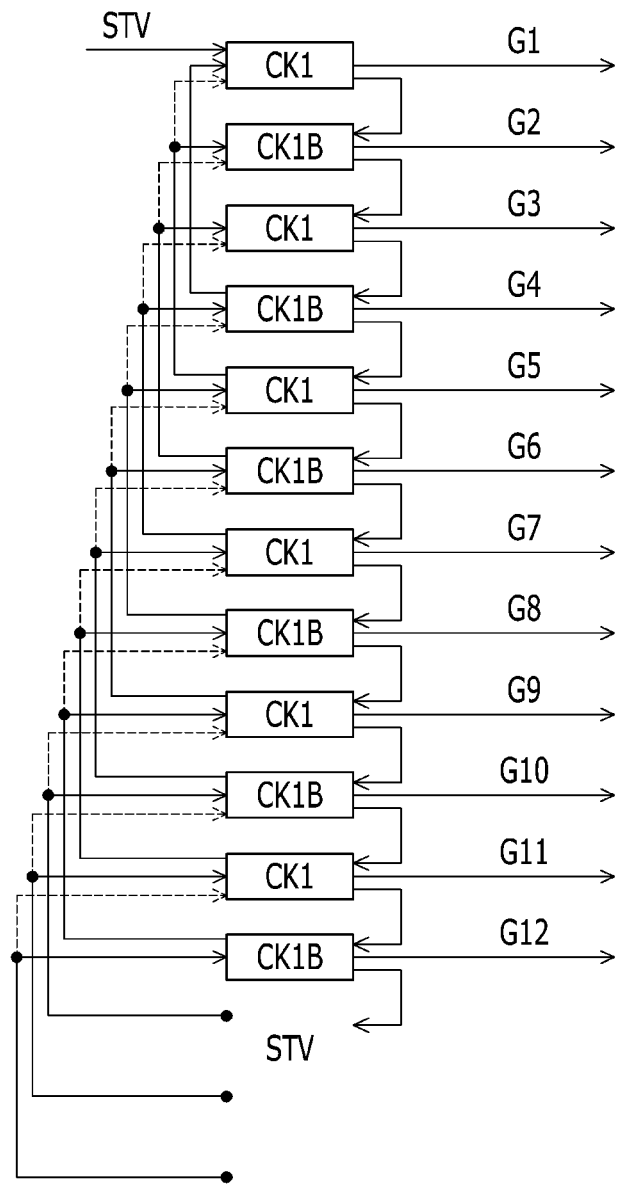
FIG. 11 is a block diagram showing a connection relationship of stages an alternative exemplary embodiment of a gate driver according to the invention.
Figure 12:
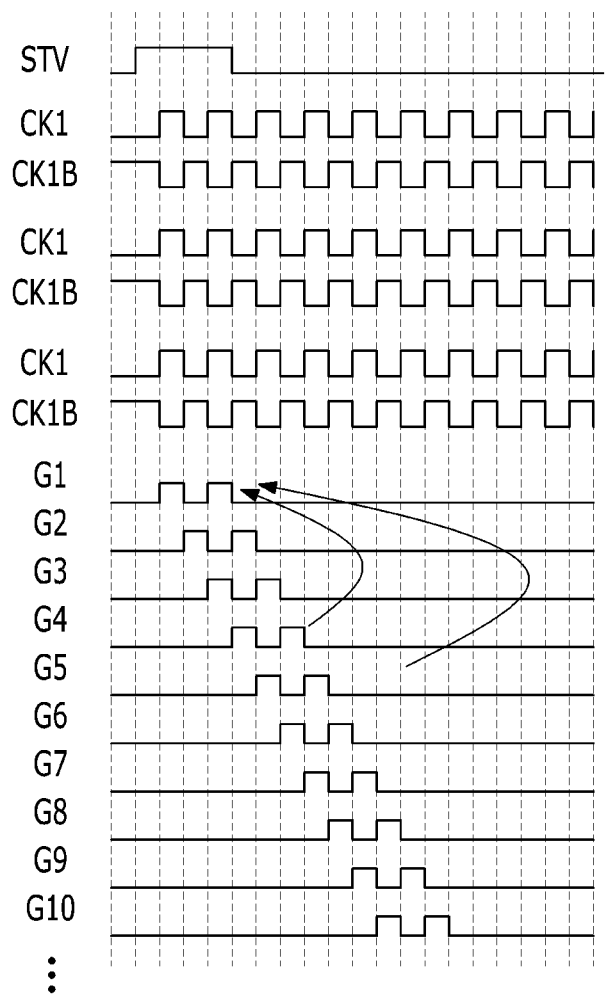
FIG. 12 is a waveform diagram of major signals that are input to/output from a gate driver shown in FIG. 11.

FIG. 11 shows an alternative exemplary embodiment of a gate driver which is substantially the same as the gate driver shown in FIG. 9 except for the connections of a carry signal between the stages, and the clock signal, and FIG. 12 shows a waveform diagram of major signals that are input to/output from the gate driver shown in FIG. 11.

In an exemplary embodiment, as described above with reference to FIG. 9, the gate driver may sequentially input the first to third clock signals and the first to third inverted clock signals (CK1-CK3, CK1B-CK3B) to the stage. In an alternative exemplary embodiment, as shown in FIG. 11, two sorts of clock signals (CK1, CK1B) may be input to the stage of the gate driver. In such an embodiment, the first clock signal CK1 may be input to the odd-numbered stages of the gate driver, and the first inverted clock signal (CK1B) may be input to the even-numbered stages. The first clock signal CK1 may have the duty ratio of about 50%, has the pulse width of 1H, and has the period of 2H. The first inverted clock signal (CK1B) may have an opposite phase of the first clock signal CK1.

In FIG. 11, an arrow on the right of the stages indicates a carry signal transmitted to another stage, and an arrow on the left thereof represents a carry signal input by another stage. The 1st stage SR1 receives a start pulse vertical signal STV to start an operation thereof and output a gate-on voltage and a carry signal CR1, and the output carry signal CR1 is transmitted to the 2nd stage CR2. The 1st stage receives the carry signal CR4 from the 4th stage SR4 to finish the operation thereof, and 1st stage may receive the carry signal CR5 from the 5th stage SR5 to finish the operation thereof. The 2nd stage SR2 receives the carry signal CR1 from the 1st stage SR1 to start an operation thereof and output a gate-on voltage and a carry signal CR2, and the output carry signal CR2 is transmitted to the 3rd stage SR3. The 2nd stage SR2 receives the carry signal CR5 from the 5th stage SR5 to finish the operation, and the 2nd stage SR2 may also receive the carry signal CR6 from the 6th stage SR6. In such a manner, the j-th stage receives the carry signal (CRj−1) from the (j−1)th stage (SRj−1) to start an operation thereof and output a gate-on voltage and a carry signal (CRj), and the output carry signal (CRj) is transmitted to the (j+1)th stage (SRj+1). The j-th stage (SRj) receives the carry signal (CRj+3) from the (j+3)th stage (SRj+3) to finish the operation thereof, and the j-th stage (SRj) may also receive the carry signal (CRj+4) from the (j+4)th stage (SRj+4) to finish the operation thereof.

When the timing of the clock signal and the connection of the carry signal are modified as described above, the gate-on voltage having the waveform shown in FIG. 12 is output by the gate driver and is applied to the gate lines (G1, G2, . . . ). The gate-on voltage is output during a gate-on period having a width of about 3H, the gate-on voltage has a low level for 1H during the gate-on period. In such an embodiment, as shown in FIG. 12, the gate-on voltage has a high level during 1st horizontal period of the gate-on period, a low level during 2nd horizontal period of the gate-on period, and the high level during 3rd horizontal period of the gate-on period. Therefore, each pixel is precharged for 1st horizontal period of the gate-on period, not precharged for 2nd horizontal period of the gate-on period, and charged for 3rd horizontal period of the gate-on period, with the data voltage of the pixel. As a result, when the data voltage is driven and inverted for each 1H, the data voltage having substantially the same polarity as the pixel is precharged to the pixel, thereby substantially improving precharging efficiency thereof.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a plurality of gate lines; and
   a gate driver comprising a plurality of stages which transmits a gate voltage to the gate lines,
   wherein
   first to fourth clock signals, and first to fourth inverted clock signals having phases opposite to phases of the first to fourth clock signals, respectively, are sequentially input to each repetition unit of the stages, wherein each repetition unit is defined by eight consecutive stages,
   a carry signal output by a j-th stage is transmitted to a (j+4)th stage,
   a carry signal output by the (j+4)th stage is transmitted to the j-th stage, wherein j is a natural number,
   the first and second clock signals are substantially the same as each other,
   the third and fourth clock signals are substantially the same as each other,
   the third clock signal is phase-delayed by about 1H from the first clock signal, wherein H is a unit time corresponding to one period of a horizontal synchronization signal,
   each stage outputs a gate-on voltage three times during a frame period,
   the frame period is divided into first to fourth sections, and
   a (2p−1)th stage and a (2p)th stage, which neighbor each other, simultaneously output a gate-on voltage in the first and fourth sections of the frame period, wherein p is a natural number.

2. The display device of claim 1, wherein
   the (j+4)th stage outputs a gate-on voltage based on the carry signal output by the j-th stage, and
   the j-th stage outputs a gate-off voltage based on the carry signal output by the (j+4)th stage.

3. The display device of claim 1, wherein
a first start pulse vertical signal is input to the 1st and 3rd stages,
a second start pulse vertical signal is input to the 2nd and 4th stages, and
a carry signal of a (j−4)th stage is input to the j-th stage when j is greater than 4.

4. The display device of claim 1, wherein
the first to fourth clock signals are sequentially phase-delayed by about 1H from one another, wherein H is a unit time corresponding to one period of a horizontal synchronization signal.

5. The display device of claim 4, wherein
each clock signal has a period of about 8H and a duty ratio of about 50%.

6. The display device of claim 5, wherein
the stages output a gate-on voltage with a width of about 4H based on a progressive scanning, and
gate-on voltages transmitted to neighboring gate lines overlap each other for about 3H.

7. The display device of claim 1, wherein
each clock signal has a period of about 4H and a duty ratio of about 50%.

8. The display device of claim 1, wherein
one of the (2p−1)th and (2p)th stages outputs the gate-on voltage in the second section of the frame period, and
the other of the (2p−1)th and (2p)th stages outputs the gate-on voltage in the third section of the frame period.

9. The display device of claim 1, wherein
a left eye image or a right eye image is displayed in the first to third sections of the frame period, and
a black inserted image is displayed in the fourth section of the frame period.

10. A display device comprising:
a plurality of gate lines; and
a gate driver comprising a plurality of stages which transmits a gate voltage to the gate lines,
wherein
first to fourth clock signals, and first to fourth inverted clock signals having phases opposite to phases of the first to fourth clock signals, respectively, are sequentially input to each repetition unit of the stages, wherein each repetition unit is defined by eight consecutive stages,
a carry signal output by a j-th stage is transmitted to a (j+4)th stage,
a carry signal output by the (j+4)th stage is transmitted to the j-th stage, wherein j is a natural number,
the first and second clock signals are substantially the same as each other,
the third and fourth clock signals are substantially the same as each other,
the third clock signal is phase-delayed by about 1H from the first clock signal, wherein H is a unit time corresponding to one period of a horizontal synchronization signal,
each stage outputs a gate-on voltage once during a frame period, which is divided into first and second sections,
one of (2p−1)th and (2p)th stages, which neighbor each other, outputs the gate-on voltage in the first section of the frame period, wherein p is a natural number, and
the other of the (2p−1)th and (2p)th stages outputs the gate-on voltage in the second section of the frame period.

11. A display device comprising:
a plurality of gate lines; and
a gate driver comprising a plurality of stages which transmits a gate voltage to the gate lines,
wherein
first to fourth clock signals, and first to fourth inverted clock signals having phases opposite to phases of the first to fourth clock signals, respectively, are sequentially input to each repetition unit of the stages, wherein each repetition unit is defined by eight consecutive stages,
a carry signal output by a j-th stage is transmitted to a (j+4)th stage,
a carry signal output by the (j+4)th stage is transmitted to the j-th stage, wherein j is a natural number,
a carry signal output by a (j+8)th stage is transmitted to the j-th stage,
the gate driver comprises n stages and eight dummy stages, wherein n is a natural number greater than 4,
carry signals output by 1st to 4th dummy stages are transmitted to (n−3)th to n-th stages, and
carry signals output by 5th to 8th dummy stages are transmitted to the 1st to 4th dummy stages and the (n−3)th to n-th stages.

12. The display device of claim 11, wherein
a first start pulse vertical signal is input to the 5th and 7th dummy stages from among the dummy stages, and
a second start pulse vertical signal is input to the 6th and 8th dummy stages.

* * * * *